United States Patent [19]

Masaichi et al.

[11] Patent Number: 5,673,484
[45] Date of Patent: Oct. 7, 1997

[54] METHOD OF MANUFACTURING A MAGNETIC HEAD SUSPENSION

[75] Inventors: Inaba Masaichi; Matsumoto Hirofumi, both of Ushiku; Tanaka Yasuyuki, Tsuchiura, all of Japan

[73] Assignee: Nippon Mektron, Ltd., Tokyo, Japan

[21] Appl. No.: 465,760

[22] Filed: Jun. 6, 1995

[30] Foreign Application Priority Data

Jul. 26, 1994 [JP] Japan .................. 6-193662

[51] Int. Cl.⁶ .................. G04D 3/00; G11B 5/48
[52] U.S. Cl. .................. 29/896.93; 216/13; 216/20; 360/104
[58] Field of Search .................. 29/896.9, 896.93; 216/13, 20; 360/104

[56] References Cited

U.S. PATENT DOCUMENTS 4,208,257  6/1980  Hom-ma et al. .................. 216/13

FOREIGN PATENT DOCUMENTS 53-74414   7/1978  Japan .
63-113917  5/1988  Japan .

*Primary Examiner*—P. W. Echols
*Attorney, Agent, or Firm*—Chilton, Alix & Van Kirk

[57] ABSTRACT

A magnetic head suspension assembly, wherein a wiring member for connecting a magnetic head element with a read/write amplifier circuit board is integrally formed with the suspension for supporting the magnetic head element. The suspension is equipped integrally with a circuit wiring pattern via a flexible insulating base material. The flexible insulating base material is made as wide as the circuit wiring pattern. The top surface of the circuit wiring pattern has a surface protecting layer which is wider than the circuit wiring pattern.

14 Claims, 4 Drawing Sheets

METHOD OF MANUFACTURING A MAGNETIC HEAD SUSPENSION

BACKGROUND OF THE INVENTION

(1) FIELD OF THE INVENTION

The present invention generally relates to a magnetic head suspension assembly used for a magnetic disk unit or the like, and a method of manufacturing the same. More particularly, the present invention relates to a magnetic head suspension assembly wherein a wiring member for connecting a magnetic head element with a read/write amplifier circuit board is integrally formed with a suspension and a method of manufacturing the same.

(2) DESCRIPTION OF THE RELATED ART

A magnetic disk unit of the type with which the present invention may be employed is equipped with at least one rotary disk for magnetically recording information, a magnetic head element for reading from or writing to each track on the disk, and a positioning actuator which is connected to the head element. The positioning actuator is used to move the head element to a desired track and maintain the head element above the selected track.

An example of a conventional magnetic head suspension assembly is disclosed in Published Japanese Patent Application No. 63-113917. In this prior art suspension assembly, the magnetic head element is attached to a flexure by epoxy resin or the like and the flexure is installed on a load beam by laser welding or the like. Gold-plated copper lead wire provided with urethane coating or the like is connected by ultrasonic bonding, soldering, or the like to a terminal on the magnetic head element, the wire(s) thus forming the lead(s) for sending a signal from the magnetic head to an external circuit. The lead wire is turned a number of times before it is housed in a flexible insulating resinous tube, and the resulting lead wire subassembly is mounted on the suspension by crimping a part of the suspension or other similar means.

Such a magnetic head suspension assembly suffers from the problem that establishing a connection between a terminal on the magnetic head element and a lead wire is an extremely inefficient procedure due to restrictions on operability, making it difficult to achieve higher productivity. This problem has been exacerbated by the increasing number of terminals resulting from the reduced sizes of magnetic head elements and the increasing use of MR elements in recent years. Furthermore, an additional problem arises because the rigidity of the lead wiring subassembly prevents the magnetic head element from obtaining an optimum position when it floats. A final problem is that the lead wiring subassembly is subjected to forces resulting from air flow produced by a rotating recording medium and these forces disturb the position of an associated floating magnetic head element.

To solve above-discussed problems, as disclosed in Published Japanese Patent Application NO. 53-74414, it has been proposed to employ a flexible circuit board which serves as both the lead wiring subassembly and the suspension mechanism which supports the magnetic head element. This approach, however, presents many problems in achieving accurate positioning, applying the appropriate load, and achieving the appropriate floating position of the magnetic head element. Since all of these problems must be faced and solved if a magnetic head suspension mechanism is to have broad utility, this approach does not provide a head suspension which be employed for present day magnetic disk units.

According to one popular approach to solving the above discussed problems regarding conventional lead wiring, a flexible circuit board, which includes all interconnecting lead wiring, is attached to a suspension spring with an adhesive agent or the like. This approach, however, unavoidably trades off weight reduction for operability because a separate flexible circuit board must be glued to the suspension spring. Preferably, the suspension and its associated magnetic head should be as light weight as possible to meet the demands for fast seek, etc.

Hence, there has been an unsatisfied demand for a magnetic suspension assembly which reduces the adverse influences on the floating position of the magnetic head exerted by the lead wiring and which also permits easier mounting of the magnetic head element by combining the lead wiring and the suspension into a single piece.

SUMMARY OF THE INVENTION

It is, accordingly, an object of the present invention to provide a magnetic head suspension assembly characterized by the lead wiring subassembly and suspension being integrated into a unitary magnetic head subassembly. It is also an object of this invention to provide a method of manufacturing such a unitary head subassembly.

To this end, the present invention provides a method of manufacturing a magnetic head suspension assembly which includes the steps of: (1) forming a laminated plate having a flexible insulating base material with a springy (i.e., resilient) metal layer on one surface and an electrically conductive layer on the other surface; (2) photoetching the electrically conductive layer of the laminated plate to produce a desired circuit wiring pattern; (3) removing the flexible insulating base material from an exposed area by irradiation with excimer laser beams, by plasma etching, or by resin etching; (4) forming a surface protecting layer on the surface of the circuit wiring pattern by a photofabrication process employs a photosensitive insulating resin; (5) photoetching the springy metal layer and (6) bending the springy metal layer into a predetermined shape to form a suspension having a desired shape.

The flexible insulating base material of the aforementioned laminated plate may be a non-photosensitive resin or of, a photosensitive insulating resin made of photosensitive polyimide, photosensitive epoxy resin, photosensitive acrylic resin, or the like. Examples of suitable non-photosensitive insulating resins are soluble polyimides and polyimide precursors such as polyamic acid.

Using the aforementioned materials makes it possible to easily form the insulating base material into a desired shape by carrying out the removing treatment using a relatively mild chemical. A further advantage is that the curing process can be performed without the need of the ablation removing treatment using excimer laser beams or the resin etching removal process which uses a hazardous chemical such as hydrazine to partially remove the insulating base material after forming the circuit wiring pattern.

After forming the insulating base material into the desired shape, the surface protecting layer is formed on the surface of the circuit wiring pattern by the photofabrication process using photosensitive insulating resin in the manner described above. Then, the aforementioned resilient metal layer is photoetched and bent into a predetermined shape, thereby producing a suspension of a desired shape.

DESCRIPTION OF THE DISCLOSED EMBODIMENTS

Figure 1:
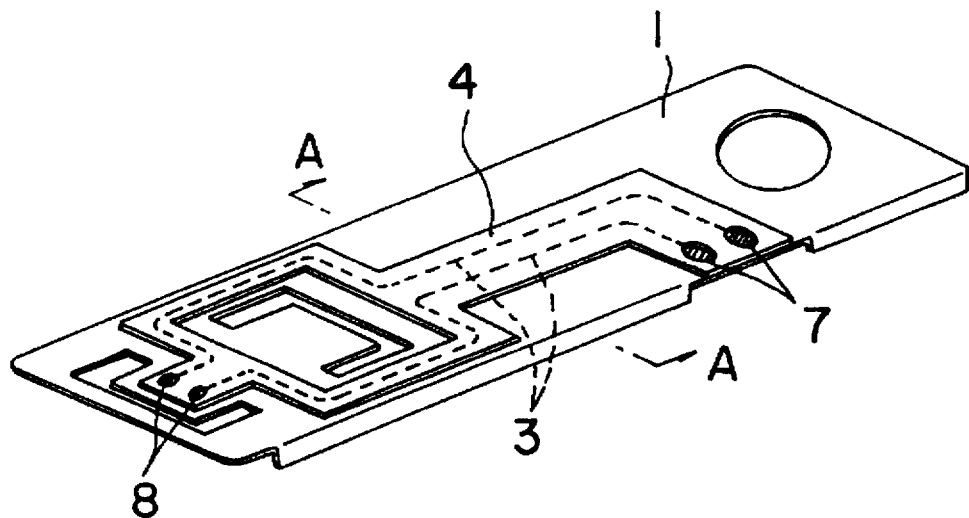
FIG. 1 is a conceptual perspective view showing a magnetic head suspension produced by the manufacturing method in accordance with the present invention.
Figure 2:
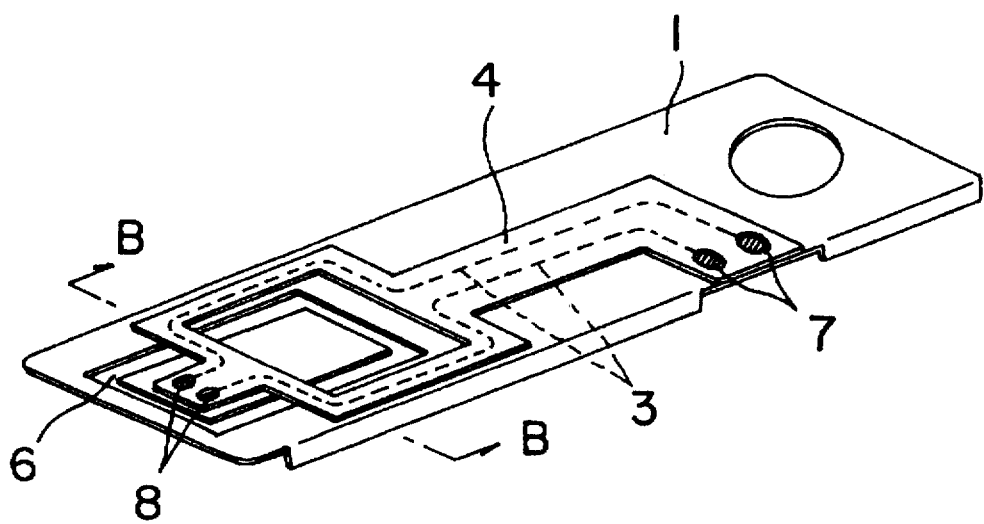
FIG. 2 is a conceptual perspective view showing another example of the magnetic head suspension produced by the manufacturing method in accordance with the present invention.

FIG. 1 and FIG. 2 are conceptual perspective views of the magnetic head suspension assembly produced by the method of manufacturing of the present invention. In the magnetic head suspension shown in FIG. 1 and FIG. 2, the wiring member for connecting a magnetic head element with a read/write amplifier circuit board and the suspension are combined into one piece.

According to the embodiment of the magnetic head suspension shown in FIG. 1, the flexible insulating base material and a circuit wiring pattern 3, which is formed on the insulating base material and covered with a surface protecting layer 4, are formed into one piece on a suspension 1 comprised of sheet metal having the requisite resiliency.

The embodiment of the magnetic head suspension shown in FIG. 2 is the same as that shown in FIG. 1 except that a part of the suspension, i.e. the flexing section of the suspension member 1 etched to produce an opening 6, and in the area of thus opening the flexing section is composed only of a part of each of the flexible insulating base material, the circuit wiring pattern 3, and the surface protecting layer 4, respectively.

In the embodiments shown in the two drawings, holes are formed in predetermined positions of the surface protecting layer 4 to make the connecting terminal section for the magnetic head element. The holes expose a part of the circuit wiring pattern 3 which can be coated with a layer of solder, gold, or the like to form connecting terminals 8. An end of the suspension 1 has terminals 7 for external connection which are formed in the same manner.

Figure 3:
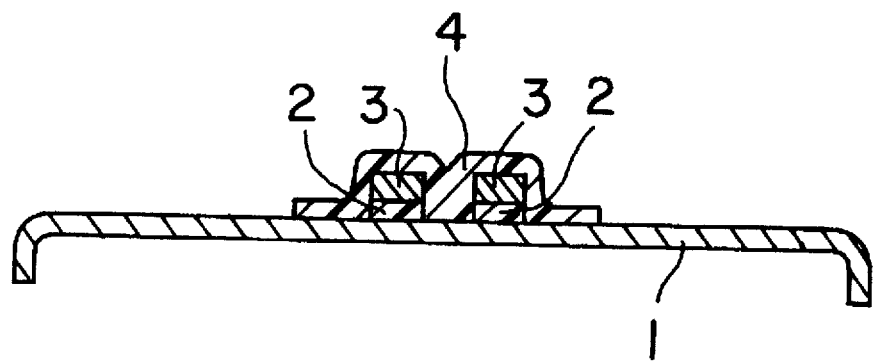
FIG. 3 is a conceptual cross-sectional block diagram taken along line A—A of FIG. 1.
Figure 4:
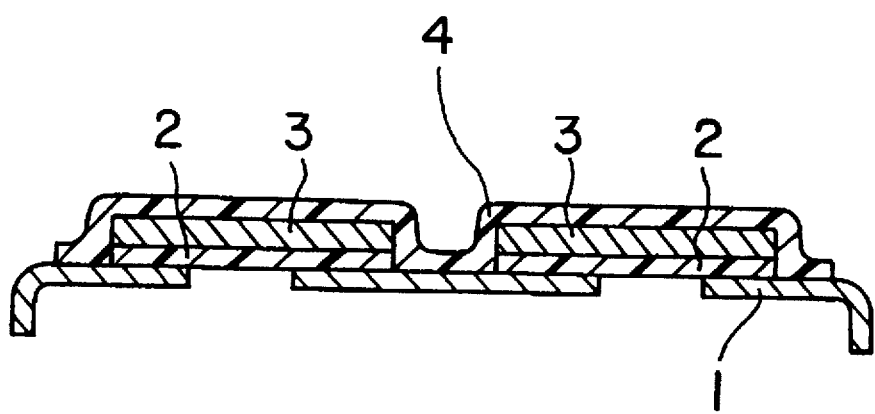
FIG. 4 is a conceptual cross-sectional block diagram taken along line B—B of FIG. 2.

FIG. 3 is a conceptual cross-sectional block diagram taken along line A—A of FIG. 1. FIG. 4 is a conceptual cross-sectional block diagram taken along line B—B of FIG. 2. In FIG. 3 and FIG. 4, reference numeral 1 denotes a suspension formed from a resilient metal such as stainless steel. A predetermined surface area of the suspension 1 which has the same width as the circuit wiring pattern is covered with the flexible insulating base material 2 made of polyimide, epoxy resin, acrylic resin, or the like. The desired circuit wiring pattern 3 is formed on the surface of the flexible insulating base material 2. Further, the surface protecting layer 4, comprised of a photosensitive insulating resin or the like, is formed on the surface of the circuit wiring pattern 3. This surface protecting layer 4 is wider than the circuit wiring pattern 3.

FIG. 5a through FIG. 5d illustrate one embodiment of a manufacturing method in accordance with the present invention. The views of FIG. 5a through FIG. 5d are taken along line A—A of the end product shown in FIG. 1.

Figure 5A:
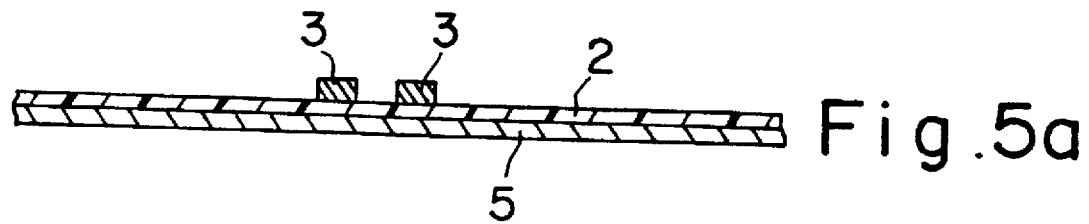
FIG. 5a through FIG. 5d illustrate one embodiment of the method of manufacturing the magnetic head suspension according to the present invention.

In FIG. 5a, the flexible insulating base material 2 made of polyimide, epoxy resin, acrylic resin, or the like, has a resilient metal layer 5 of stainless steel or the like, for forming the suspension, on one surface, and a laminated plate having an electrically conductive layer of copper foil or the like on the other surface. The electrically conductive layer is photoetched to produce a desired circuit wiring pattern 3. For better flexibility, a laminated plate with no adhesive agent between its layers should be used; however, a laminated plate formed with the use of an adhesive agent may be used when an excimer laser is employed. The following process uses the adhesive-less laminated plate.

Figure 5B:
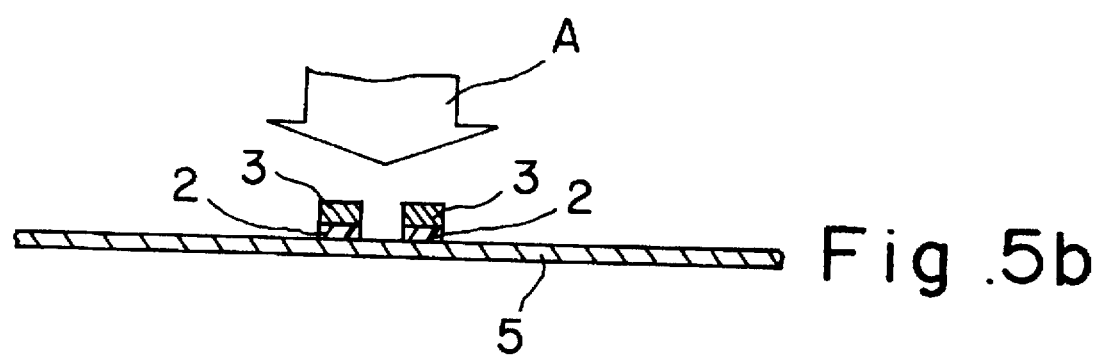

In the next step, as illustrated in FIG. 5b, the exposed area of the insulating base material 2 is irradiated by an excimer laser beam A. The insulating base material is removed by ablation to form the circuit wiring pattern 3. Alternatively, the exposed insulating base material 2 can also be removed by plasma etching or by resin-etching with a strong alkaline chemical such as hydrazine, where the circuit wiring pattern 3 is used as the etching mask.

Figure 5C:
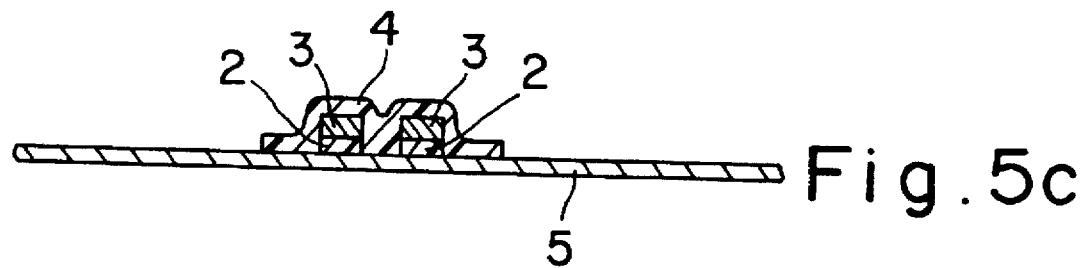

Then, as shown in FIG. 5c, photosensitive insulating resin is applied to the circuit wiring pattern 3. The photosensitive insulating resin is then exposed, developed and cured to produce the wide surface protecting layer 4 clad onto the circuit wiring pattern 3.

Figure 5D:
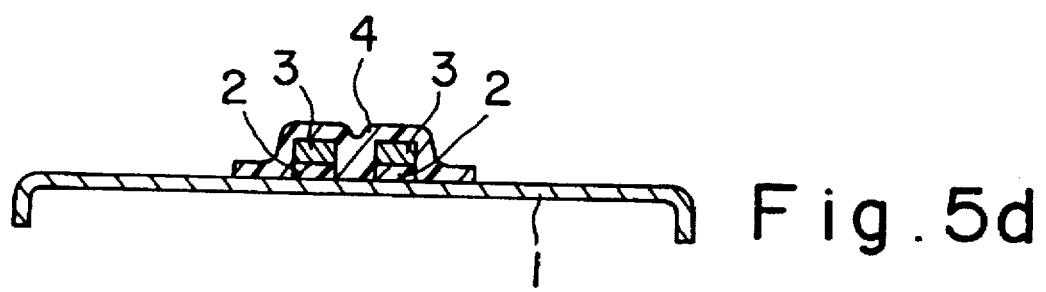

Lastly, as shown in FIG. 5d, the resilient metal layer 5 is photoetched and bent into a desired shape to form the suspension 1, thus producing the integrated magnetic head suspension and interconnection circuitry.

FIG. 6a through FIG. 6d illustrate a another embodiment of the method of manufacturing a magnetic head suspension assembly according to the present invention. The laminated plate used for this embodiment has a flexible insulating base material 2 comprised of a non-photosensitive resin such as a soluble polyimide or a polyimide precursor such as polyamic acid. The flexible insulating base material 2 has a resilient metal layer 5 of stainless steel or the like, for forming the suspension, on one surface and an electrically conductive layer of copper foil or the like on the other surface.

To obtain such a laminated plate, the non-photosensitive polyimide is clad to one surface of the resilient metal layer or alternatively the non-photosensitive polyimide is clad to one surface of the electrically conductive layer, and the metal layer is then attached. In either case, the multi-layer intermediate is subjected to precuring treatment to complete the laminated plate. As another alternative, the metal layer may be attached after the precuring treatment to complete the laminated plate. As yet another alternative, the non-photosensitive polyimide may be clad to one surface of the resilient metal layer and also to one surface of the electrically conductive layer, then they are subjected to the pre-curing treatment to laminate them or they are laminated before the precuring treatment to complete the laminated plate.

The electrically conductive layer of the laminated plate thus produced, is photoetched to form the desired circuit wiring pattern 3.

Figure 6A:
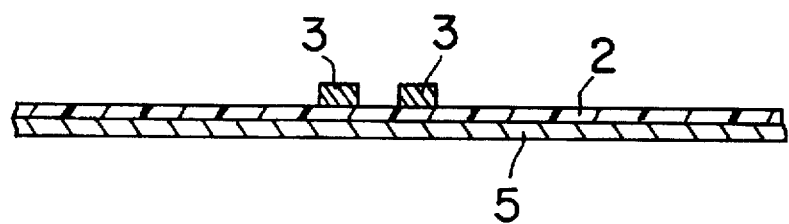
FIG. 6a through FIG. 6d illustrate another embodiment of the method of manufacturing a magnetic head suspension according to the present invention.
Figure 6B:
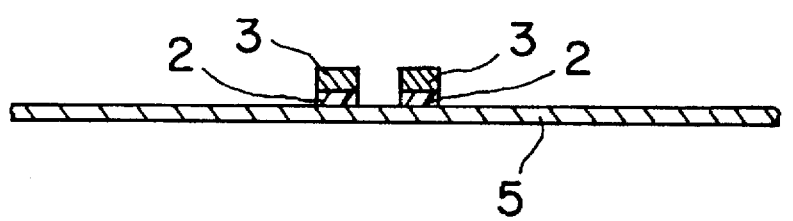

As shown in FIG. 6b, the circuit wiring pattern 3 can be used as a resist layer, and the exposed insulating base material 2 removed with a developer suited for the insulating resin before it is subjected to the curing process. This results in the same construction as that shown in FIG. 5b.

Figure 6C:
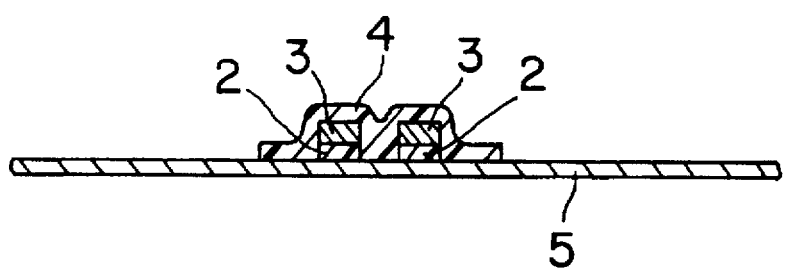
Figure 6D:
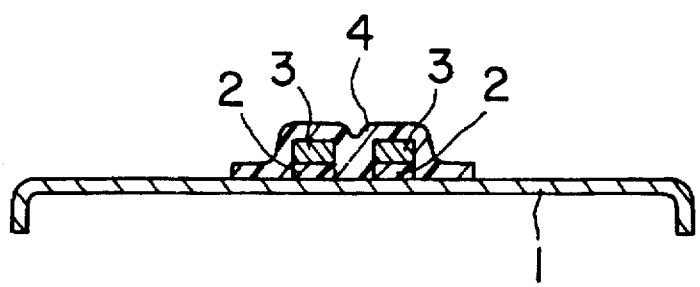

Next, the steps represented by FIG. 6c and FIG. 6d are carried in same manner as those of FIG. 5c and FIG. 5d to produce a magnetic head suspension integrated with the circuit wiring in the same manner as that in the embodiment described above.

An alternative embodiment of the present invention incudes a variation on the process steps illustrated in FIG. 6a and FIG. 6b. This alternative process uses a photosensitive insulating resin composed of photosensitive polyimide, photosensitive epoxy resin, photosensitive acrylic resin, or the like for the flexible insulating base material 2.

As described above, the flexible insulating base material 2 has a resilient metal layer 5 of stainless steel or the like, for forming the suspension, on one surface and the laminated plate having the electrically conductive layer of copper foil or the like on the other surface. The same process as described in the embodiment above may be employed to make the laminated plate.

The electrically conductive layer of the laminated plate thus produced is photoetched to form the desired circuit wiring pattern 3 as shown in FIG. 6a. By using the circuit wiring pattern 3 as a resist layer, the exposed area of the insulating base material 2 is removed by exposure and development before it is subjected to the curing process, thus obtaining the same construction as that shown in FIG. 6b.

Next, the steps illustrated in FIG. 6c and FIG. 6d, including the step for producing the surface protecting layer 4 and the step for producing the suspension 1, are carried out. Thus, a magnetic head suspension integrated with circuit wiring can be produced as in the embodiments described above.

The method of manufacturing the magnetic head suspension in accordance with the present invention allows the desired circuit wiring to be integrally formed with the suspension. Furthermore, making the width of the flexible insulating base material identical to the width of the circuit wiring pattern reduces the influence which the circuit wiring has on the spring i.e. the flexibility of the suspension. The present invention is also advantageous in that it eliminates the need for gluing a discrete flexible circuit board to a suspension. Thus the present invention eliminates the need of trading off weight reduction for operability required in the prior art.

In addition, using a non-photosensitive polyimide or photosensitive insulating resin for the flexible insulating base material of the laminated plate makes it possible to form the insulating base material into a desired shape by using a mild chemical instead of a hazardous chemical such as hydrazine.

The methods of manufacturing a magnetic head suspension of the present invention make it possible to provide a magnetic head suspension with integral circuit wiring, the head suspension being capable of achieving improved operability and reduced weight. The present invention also results in the manufacture of a magnetic head assembly which is susceptible to accurate positioning, the application of appropriate load, and the achievement of a floating position of the magnetic head element as required of a magnetic head suspension.

We claim:

1. A method of manufacturing a magnetic head suspension assembly, comprising the steps of:

forming a laminated plate having a flexible insulating base material which has a resilient metal layer on one surface and an electrically conductive layer on the other surface;

selectively removing said electrically conductive layer of said laminated plate to form a desired circuit wiring pattern and an area of exposed flexible insulating base material;

removing said flexible insulating base material from said exposed area;

producing a surface protecting layer on the surface of said circuit wiring pattern; and shaping said resilient metal layer into a predetermined shape.

2. A method of manufacturing a magnetic head suspension assembly according to claim 1, wherein said flexible insulating base material is removed from said exposed area by irradiating said exposed area using an excimer laser beam.

3. A method of manufacturing a magnetic head suspension assembly according to claim 1, wherein said flexible insulating base material is removed from said exposed area using a plasma etching process.

4. A method of manufacturing a magnetic head suspension assembly according to claim 1, wherein said flexible insulating base material is removed from said exposed area using a resin etching process.

5. A method of manufacturing a magnetic head suspension assembly according to claim 1, wherein said step of shaping comprises photoetching said springy metal layer and bending said resilient metal layer into a predetermined shape.

6. A method of manufacturing a magnetic head suspension assembly, comprising the steps of:

forming a laminated plate having a flexible insulating base material comprised of a non-photosensitive resin selected from the group consisting of a non-photosensitive polyimide and a polyimide precursor, wherein said flexible insulating base material has a resilient metal layer on one surface and an electrically conductive layer on the other surface;

selectively removing said electrically conductive layer of said laminated plate to form the desired circuit wiring pattern and an area of exposed flexible insulating base material;

removing said flexible insulating base material from said exposed area using a chemical;

curing said flexible insulating base material remaining beneath said circuit wiring pattern;

producing a surface protecting layer on the surface of said circuit wiring pattern; and shaping said resilient metal layer into a predetermined shape.

7. A method of manufacturing a magnetic head suspension assembly according to claim 6, wherein said non-photosensitive polyimide is a soluble polyimide.

8. A method of manufacturing a magnetic head suspension assembly according to claim 7, wherein said polyimide precursor is polyamic acid.

9. A method of manufacturing a magnetic head suspension assembly according to claim 6, wherein said step of shaping comprises photoetching said resilient metal layer and bending said resilient metal layer into a predetermined shape.

10. A method of manufacturing a magnetic head suspension assembly, comprising the steps of:

forming a laminated plate having a flexible insulating base material made of a photosensitive insulating resin, wherein said flexible insulating base material has a springy metal layer on one surface and an electrically conductive layer on the other surface;

selectively removing said electrically conductive layer of said laminated plate to form a desired circuit wiring pattern and an area of exposed flexible insulating base material;

removing said flexible insulating base material from said exposed area by exposure and development;

curing said flexible insulating base material remaining beneath said circuit wiring pattern;

producing said surface protecting layer on the surface of said circuit wiring pattern using a photofabrication process which employs a photosensitive insulating resin; and shaping said resilient metal layer into a predetermined shape.

11. A method of manufacturing a magnetic head suspension assembly according to claim 10, wherein said photosensitive insulating resin is a photosensitive polyimide.

12. A method of manufacturing a magnetic head suspension assembly according to claim 10, wherein said photosensitive insulating resin is a photosensitive epoxy resin.

13. A method of manufacturing a magnetic head suspension assembly according to claim 10, wherein said photosensitive insulating resin is a photosensitive acrylic resin.

14. A method of manufacturing a magnetic head suspension assembly according to claim 10, wherein said step of shaping comprises photoetching said resilient metal layer and bending said resilient metal layer into a predetermined shape.

* * * * *

UNITED STATES PATENT AND TRADEMARK OFFICE
CERTIFICATE OF CORRECTION

PATENT NO.  : 5,673,484
DATED       : Oct. 7, 1997
INVENTOR(S) : Inaba et al

It is certified that error appears in the above-indentified patent and that said Letters Patent is hereby corrected as shown below:

Title page, item [75] Inventors:
    "Inaba Masaichi" should be -- Masaichi Inaba --.
    "Matsumoto Hirofumi" should be -- Hirofumi Matsumoto --.
    "Tanaka Yasuyuki" should be -- Yasuyuki Tanaka --.

Claim 5, line 3, "springy" should be -- resilient --.

Claim 8, line 2, "7" should be -- 6 --.

Claim 10, line 6, "springy" should be -- resilient --.

Signed and Sealed this

Thirtieth Day of December, 1997

Attest:

BRUCE LEHMAN

Attesting Officer

Commissioner of Patents and Trademarks